United States Patent
Kuniya et al.

(10) Patent No.: US 8,597,478 B2
(45) Date of Patent: Dec. 3, 2013

(54) METHOD FOR MANUFACTURING A SPUTTERING TARGET STRUCTURE

(75) Inventors: Tsutomu Kuniya, Yokohama (JP); Nobuyuki Suzuki, Fuji (JP); Akira Terashi, Fuji (JP)

(73) Assignee: Plansee SE, Reutte (AT)

( * ) Notice: Subject to any disclaimer, the term of this patent is extended or adjusted under 35 U.S.C. 154(b) by 16 days.

(21) Appl. No.: 13/342,465

(22) Filed: Jan. 3, 2012

(65) Prior Publication Data

US 2012/0097356 A1    Apr. 26, 2012

Related U.S. Application Data

(62) Division of application No. 12/159,739, filed as application No. PCT/JP2006/326070 on Dec. 27, 2006, now abandoned.

(30) Foreign Application Priority Data

Dec. 28, 2005   (JP) ................................. 2005-376811

(51) Int. Cl.
   *C23C 14/34*   (2006.01)
(52) U.S. Cl.
   USPC ............... 204/298.12; 204/298.13; 228/173.2
(58) Field of Classification Search
   USPC .......................... 228/173.2, 262.9, 164, 245; 204/298.12, 298.13, 298.09; 419/8, 38, 419/25, 26, 30, 48, 49, 67
   See application file for complete search history.

(56) References Cited

U.S. PATENT DOCUMENTS

| | | | | |
|---|---|---|---|---|
| 5,879,524 A * | 3/1999 | Hurwitt et al. | ............ | 204/298.12 |
| 6,344,117 B2 * | 2/2002 | Enomoto et al. | ......... | 204/298.09 |
| 6,596,139 B2 * | 7/2003 | Scott et al. | ................ | 204/298.12 |
| 6,619,537 B1 * | 9/2003 | Zhang et al. | ................... | 228/194 |
| 6,708,870 B2 * | 3/2004 | Koenigsmann et al. | ...... | 228/210 |
| 2007/0045108 A1 * | 3/2007 | Demaray | ................ | 204/298.12 |

FOREIGN PATENT DOCUMENTS

| | | |
|---|---|---|
| JP | 62-149865 | 7/1987 |
| JP | 8-246144 | 9/1996 |
| JP | 11-189870 | 7/1999 |
| JP | 11-200030 | 7/1999 |

* cited by examiner

*Primary Examiner* — Roy King
*Assistant Examiner* — Michael Aboagye
(74) *Attorney, Agent, or Firm* — Young & Thompson

(57) ABSTRACT

To provide a sputtering target structure which has good machinability and thermal conductivity and has good wettability with soldering materials, which is inexpensive and can be used repeatedly for a long period of time, and which is free from problems of cracking and peeling of the sputtering target therein, a sputtering target structure is formed by bonding a sputtering target and a backing plate. The backing plate is formed of a material that has the difference in the linear expansion coefficient between it and the sputtering target material of at most $2\times10^{-6}$/K, and a copper plate having a thickness of from 0.3 to 1.5 mm is disposed on at lest one face of the backing plate.

3 Claims, 2 Drawing Sheets

METHOD FOR MANUFACTURING A SPUTTERING TARGET STRUCTURE

This application is a division of application Ser. No. 12/159,739 filed on Jun. 30, 2008 now abandoned; which is the 35 U.S.C. 371 national stage of International application PCT/JP2006/326070 filed on Dec. 27, 2006; which claimed priority to Japan application 2005-376811 filed Dec. 28, 2005, respectively. The entire contents of each of the above-identified applications are hereby incorporated by reference.

TECHNICAL FIELD

The present invention relates to a sputtering target structure for use in a sputtering step in production of a thin film for hard coating or decorative coating of flat panel displays (hereinafter referred to as "FPD") such as liquid-crystal displays, plasma displays, etc.

BACKGROUND ART

Thin film formation through sputtering comprises introducing a rare gas such as argon into a vacuum chamber, applying a negative voltage to the sputtering target in the chamber to cause glow discharge therein, making the thus-formed plasma cations collide with the sputtering target, and depositing the thus-released, sputtering target-constitutive atom on the substrate disposed opposite to the target.

Typically, the sputtering target includes aluminium, aluminium alloy, high-melting-point metal (e.g., tungsten, molybdenum, titanium) and its alloy, high-melting-point silicide (e.g., molybdenum silicide, tungsten silicide); and recently, a sintered ITO (indium-tin-oxide) body has become used for it.

A backing plate functions as a support, and further functions as a cooling medium for removing heat from the sputtering target that generates heat therein during sputtering. Accordingly, the backing plate generally has a cooling mechanism inside it.

For the backing plate, used are oxygen-free copper, copper alloy, aluminium alloy, stainless steel, titanium alloy, etc. Of those, a copper backing plate is favorably used, as its thermal conductivity is good. However, its linear expansion coefficient is $17 \times 10^{-6}$/K and is large, and this is problematic in that its deformation is great owing to its elongation in repeated use and, after used a few times, it could no more be reused.

The sputtering target for use in the above-mentioned sputtering step is generally used in the form of a structure thereof soldered to a backing plate with a low-melting-point soldering material.

In the sputtering step, when the sputtering target structure is heated high owing to the collision of plasma cations therewith and when there is a great difference in the linear expansion coefficient between the sputtering target and the backing plate constituting it, then the sputtering target structure may deform like a bimetal. The deformation may occur also in producing the sputtering target structure.

The deformation produces some problems in that the sputtering target may crack, the soldering material may fuse and the soldered part may peel.

Accordingly, a sputtering target structure is desired, which does not cause bimetal deformation even when exposed to high temperatures in sputtering and which is therefore free from the problems of cracking and peeling of the sputtering target thereof.

Recently, molybdenum and titanium have become used as a sputtering target material, and the linear expansion coefficient of these metals greatly differs from the linear expansion coefficient of copper that is favorably used for a backing plate material. Therefore, the requirement for the sputtering target structure free from the above-mentioned problems is great.

For obtaining the sputtering target structure free from the above-mentioned problems, various proposals have heretofore been made.

For example, investigations of soldering materials and soldering methods have produced a method comprising disposing a tin alloy sheet or the like between a sputtering target and a cooling plate (backing plate), putting an indium alloy between the sheet and the sputtering target and between the sheet and the cooling plate, and heat-sealing them (Patent Reference 1); a method comprising subjecting a sputtering target for plating to a pretreatment such as plating or vapor deposition thereon and inserting a buffer material between the sputtering target and a cooling plate (backing plate) (Patent Reference 2); a method comprising inserting an insert material between a sputtering target and a cooling plate (backing plate) (Patent Reference 3); a method comprising inserting a heat-conductive adhesive between a sputtering target and a backing plate and adhering them with a low-melting-point metal disposed between the adhesive and the sputtering target and/or the backing plate (Patent Reference 4).

These methods are to attain the effect through modification of the constitution of the thin solder material layer between the sputtering target and the backing plate, and they could hardly attain the intended effect. In these methods, in addition, the minus effect of thermal conductivity depression owing to the disposition of various materials between the sputtering target and the backing plate cannot be bypassed. Further, the use of indium is problematic in point of its cost.

On the other hand, a backing plate investigation has proposed a method of forming a three-layered backing plate structure of molybdenum-titanium-molybdenum, as is disclosed in Patent Reference 5. This is for making the linear expansion coefficient of the backing plate the same as that of the sputtering target to be combined with it.

Patent Reference 6 discloses a backing plate formed of a composite material of molybdenum and copper.

Patent Reference 7 proposes production of a backing plate from a composite material of aluminium or aluminium alloy with ceramic.

However, these materials have poor machinability, and are hardly applicable to large-sized products for FPD for which, in particular, the thermal expansion difference between the sputtering target and the backing plate is especially problematic.

Patent Reference 8 proposes a backing plate comprising titanium. However, its thermal conductivity is extremely low and this is unfavorable to a structure of a sputtering target and a backing plate equipped with a cooling mechanism.

Further, Patent Reference 9 proposes a technique of providing grooves on the surface of a backing plate to be bonded to a sputtering target. In this, the grooves are to absorb thermal deformation, but on the other hand, this is problematic in that its thermal conductivity depression is inevitable.

Patent Reference 1: JP-A 61-250167
Patent Reference 2: JP-A 5-25620
Patent Reference 3: JP-A 4-365857
Patent Reference 4: JP-A 2000-160334
Patent Reference 5: JP-A 8-246144
Patent Reference 6: JP-A 62-67168
Patent Reference 7: JP-A 2002-161361
Patent Reference 8: JP-A 6-293963
Patent Reference 9: JP-A 2-43362

DISCLOSURE OF THE INVENTION

Problems that the Invention is to Solve

Accordingly, an object of the invention is to provide a puttering target structure which has good machinability and thermal conductivity and has good wettability with soldering materials, which is inexpensive and can be used repeatedly for a long period of time, and which is free from problems of cracking and peeling of the sputtering target therein.

Means for Solving the Problems

For attaining the above-mentioned object, we, the present inventors have assiduously studied the constitution of a sputtering target structure and the materials of the members constituting it, and, as a result, have found that use of a composite material of aluminium with a substance having a small linear expansion coefficient for the main material of a backing plate may solve the problems, and on the basis of this finding, we have further studied and have finally completed the present invention.

Accordingly, the invention provides a sputtering target structure formed by bonding a sputtering target and a backing plate, wherein the backing plate is formed of a material that has a linear expansion coefficient different from that of the sputtering target material by at most $2 \times 10^{-6}$/K, and a copper plate having a thickness of from 0.3 to 1.5 mm is disposed on at lest one face of the backing plate.

Preferably in the sputtering target structure of the invention, the material to constitute the backing plate is a composite material that comprises aluminium or aluminium alloy as the matrix and, as incorporated therein, one or more granular or fibrous reinforcing materials selected from the group consisting of carbon, silicon carbide, alumina, silicon nitride, mullite and aluminium borate, and the material has a linear expansion coefficient of from 3.5 to $17 \times 10^{-6}$/K.

Also preferably in the sputtering target structure of the invention, the sputtering target and the backing plate are bonded together with indium, tin or their alloy.

Also preferably in the sputtering target structure of the invention, the backing plate has a cooling channel inside it and the inner cooling channel is a copper or stainless steel pipe.

Effect of the Invention

In the sputtering target structure of the invention, the difference in the linear expansion coefficient between the sputtering target and the backing plate is small; and therefore, even at high temperatures, the structure does not warp and the sputtering target and the backing plate therein do not peel from each other, and the structure enables stable sputtering. In addition, the sputtering target structure of the invention is inexpensive and can be used repeatedly many times, and its economical advantages are great.

DESCRIPTION OF REFERENCE NUMERALS

Figure 1:
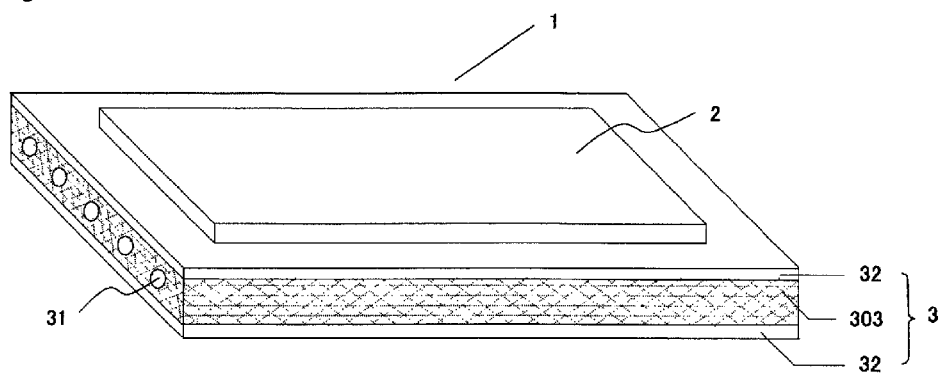
[FIG. 1] It is a schematic view of a sputtering target structure.

1 Sputtering target structure
2 Sputtering target
3 Backing plate
30 Shaped article of reinforcing material
301 Carbon fiber
302 Aluminium melt
303 Composite material of aluminium and carbon fiber
31 Stainless steel pipe for cooling
32 Copper plate
4 Iron chamber
41 Space
5 High-pressure casting mold

BEST MODE FOR CARRYING OUT THE INVENTION

The sputtering target structure of the invention comprises a sputtering target and a backing plate bonded to each other.

Not specifically defined, the sputtering target may be formed of any known sputtering target material, but preferably has a linear expansion coefficient of from 3.5 to $17 \times 10^{-6}$/K.

The size of the sputtering target is not also specifically defined.

Not specifically defined, the material to constitute the backing plate in the invention may be any one that has the difference in the linear expansion coefficient between it and the sputtering target material of at most $\pm 2 \times 10^{-6}$/K.

In the invention, the material to form the backing plate is preferably a composite material that comprises aluminium or aluminium alloy as the matrix and, as incorporated therein, one or more granular or fibrous reinforcing materials selected from the group consisting of carbon, silicon carbide, alumina, silicon nitride, mullite and aluminium borate, and the material has a linear expansion coefficient of from 3.5 to $17 \times 10^{-6}$/K.

Formation of the backing plate from the above-mentioned material betters the machinability of the formed backing plate, and facilitates the process of forming holes in the plate through which the plate is fitted in a vacuum chamber.

In case where a hardly-machinable material such as silicon carbide is used as the reinforcing material, the composite material containing it may be hardly machined, and therefore, it is desirable that the material is used in a part of the structure that does not require machining.

In the invention, the blend ratio of the reinforcing material to constitute the composite material may be suitably selected so that the resulting composite material may have the above-mentioned linear expansion coefficient.

For example, when molybdenum having a linear expansion coefficient of $5.1 \times 10^{-6}$/K is used as a sputtering target material, then the composite material to be combined with it may comprise a JIS-AC3A alloy and carbon fibers, having a linear expansion coefficient of from 4 to $5.5 \times 10^{-6}$/K.

When a titanium alloy having a linear expansion coefficient of $9 \times 10^{-6}$/K is used as a sputtering target material, then the composite material to be combined with it may comprise a JIS-A1050 alloy containing silicon carbide powder in an amount of 65% by volume and carbon fibers and having a linear expansion coefficient of from 8.5 to $9.5 \times 10^{-6}$/K.

Other combination examples of various sputtering target materials and composite materials suitable to the sputtering target materials are shown in Table 1.

TABLE 1

| Target Material | | Composite Material for Backing Plate | |
|---|---|---|---|
| Metal | Linear Expansion Coefficient (*) ($\times 10^{-6}$/K) | Composition (vol. %) | Linear Expansion Coefficient ($\times 10^{-6}$/K) |
| copper | 16.6 | aluminum 80-alumina 20 | 17-18 |
| titanium | 8.5 | aluminum 35-silicon carbide 65 | 8-9 |
| chromium | 6 | aluminum 25-silicon carbide 75 | 6-7 |
| molybdenum | 5 | aluminum 70-carbon fibers 30 | 5-6 |
| | | aluminum 100 | 25 |

(*) From "Physical Dictionary" by Baifu-kan.

The backing plate to constitute the sputtering target structure of the invention has a copper plate disposed on its side.

The copper plate may be disposed on at least one face of the backing plate, but is preferably disposed on both faces, or that is, on the front and the back faces of the backing plate for more effectively preventing the deformation of the backing plate owing to its bimetal action.

The thickness of the copper plate is from 0.3 to 1.5 mm, preferably from 0.5 to 1.2 mm. When the thickness is more than 1.5 mm, then it is unfavorable since the thermal expansion of the backing plate may be large. On the contrary, when the thickness is less than 0.3 mm, then it is also unfavorable since the workability of the backing plate may be poor in forming it.

Copper has better solder-wettability and thermal conductivity than aluminium, and therefore, when a copper plate is disposed on both faces of the backing plate, then the backing plate may realize excellent solder-wettability and thermal conductivity.

Not specifically defined, a copper plate may be disposed on the side of the backing plate in any desired manner. For example, according to the method mentioned below, a copperplate may be bonded to the backing plate while the backing plate is cast.

In the invention, a cooling channel is disposed inside the backing plate.

Provision of the cooling channel inhibits the expansion of the backing plate by the heat from the sputtering target to be sputtered, and prevents the low-melting-point solder material from melting, therefore preventing the sputtering target from peeling from the backing plate.

Regarding its material, the cooling channel is preferably formed of stainless steel or copper.

For forming the cooling channel inside the backing plate, it is desirable that the composite material for the backing plate is cast and solidified into the plate, while integrated with the pipes formed of the material for the channel to be inside the plate.

Not specifically defined, the cross-sectional profile of the pipe for the cooling channel may be circular, angular or oval.

For producing the backing plate, concretely, the following method may be employed.

For example, a reinforcing material is filled into the space of an iron mold while pipes to be a cooling channel are put in the mold. The method for filling the reinforcing material is not specifically defined. A reinforcing material may be cast into the mold in the form of a silica slurry or the like.

Next, the mold with the cooling pipes and slurry therein is subjected to heat treatment, whereby the slurry is fired and the sintered article of the reinforcing material is taken out of the mold.

A copper plate is fitted to the sintered article in any desired manner, then this is put in a high-pressure casting mold, and an aluminium melt is cast into the mold and solidified under high pressure.

The sputtering target structure of the invention may be produced by bonding a sputtering target to the backing plate thus produced in the manner as above.

Bonding the sputtering target to the backing plate may be effected by the use of any known solder material, for which preferred is indium, tin or their alloy.

In the sputtering target structure of the invention, such an inexpensive tin alloy may produce a sufficient bonding force, and the structure is therefore economical and advantageous.

EXAMPLES

The invention is described in more detail with reference to the following Examples, to which, however, the invention should not be limited.

Example 1

This is described with reference to the drawings.

Figure 2:
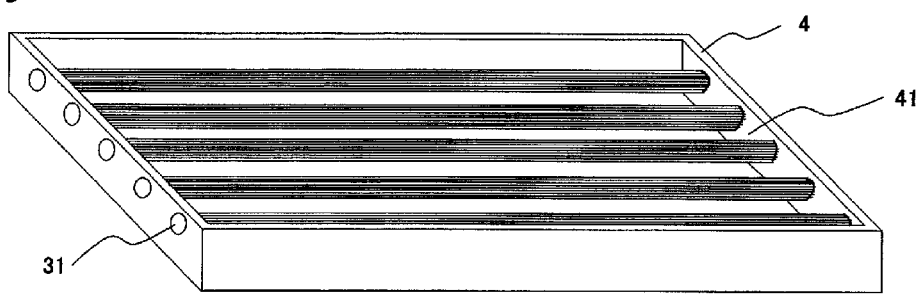
[FIG. 2] It is a schematic view of a disposition of cooling pipes in an iron chamber.
Figure 3:
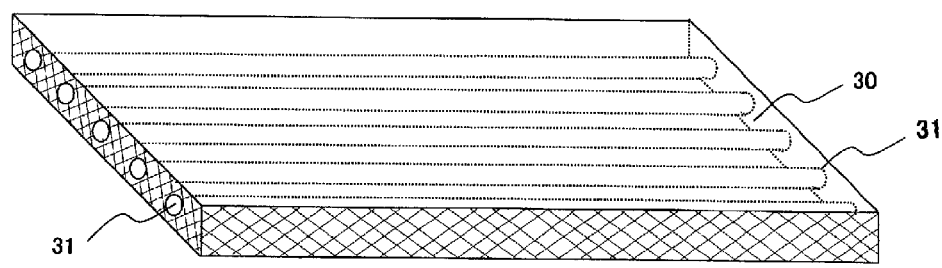
[FIG. 3] It is a schematic view of a shaped article formed by sintering a reinforcing material.

Five stainless steel pipes 31 (outer diameter 15 mm, pipe wall thickness 1 mm) were aligned in an iron chamber 4 having a length of 2,000 mm a width of 400 mm and a depth of 40 mm, at regular intervals in the cross direction of the chamber (the distance between the side of the chamber and the outermost pipe in the cross direction was 30 mm), in such a manner that the distance from the bottom surface or the top surface of the chamber to the pipe could be the same (FIG. 2). The space 41 was filled with a reinforcing material, or that is, carbon fibers 301 having a diameter of 8 μm and a length of 10 mm so that the volume percentage of the carbon fibers in the space 41 could be 30%. Next, 5% by weight of silica sol was cast into it, dried at 100° C., then fired in nitrogen at 700° C., and thereafter the iron chamber 4 was removed to obtain a carbon fiber shaped article 30 with the stainless steel pipes 31 built therein (FIG. 3).

Figure 4:
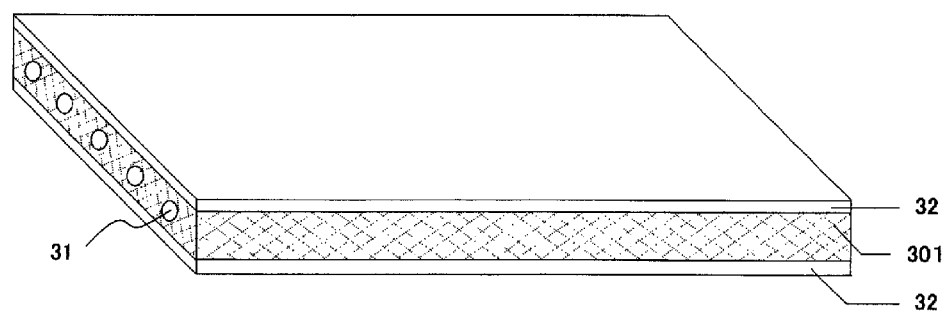
[FIG. 4] It is a schematic view of a shaped article with a copper plate disposed on both faces thereof.
Figure 5:
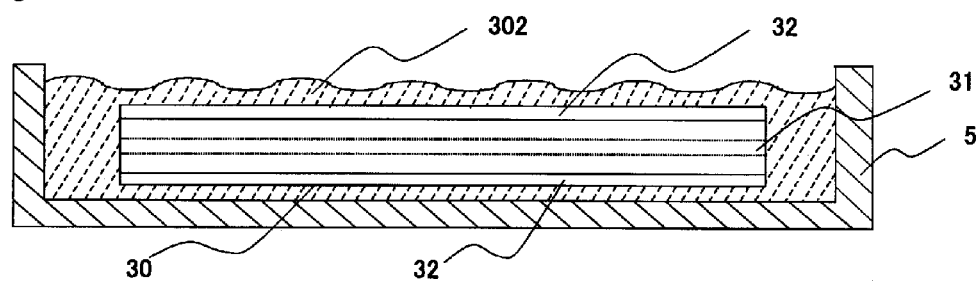
[FIG. 5] It is a cross-sectional view of a high-pressure casting device.
Figure 6:
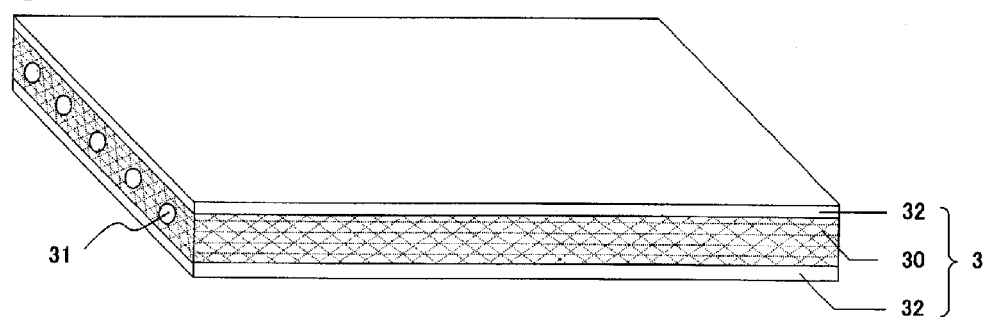
[FIG. 6] It is a schematic view of a backing plate.

A copper plate 32 having a thickness of 1 mm, a length of 2,000 mm and a width of 400 mm was disposed on both faces of the shaped article 30 (FIG. 4), and put in a high-pressure casting mold 5 (FIG. 5). An aluminium melt 302 at 800° C. was cast into the mold 5 and solidified under high pressure at a pressure of 55 MPa. After thus completely solidified, the cast product was taken out, the excess aluminium part was removed, and a baking plate 3 was thus obtained, comprising a composite material 303 of aluminium 302 and carbon fibers 301, containing stainless pipes 31 built therein, and having copper plate 32 disposed on both surfaces thereof (FIG. 6).

The linear expansion coefficient of the backing plate 3 was $5.6 \times 10^{-6}$/K.

Next, onto the copper plate 32 disposed on one side of the backing plate 3, a solder tin was applied at 280° C. Next, a molybdenum sputtering target 2 (having a thickness of 15 mm, a length of 1,900 mm and a width of 350 mm) was bonded to it to complete a sputtering target structure 1 of the invention (FIG. 1). In this, the solder wettability of the parts was good.

The sputtering target structure 1 was used for sputtering. The sputtering target structure 1 was stable until the sputtering target 2 was consumed.

A new sputtering target was bonded to the used backing plate, and the resulting structure was used for sputtering.

After three-times repeated use of the backing plate 3, the plate deformed little, and the plate was resistant to repeated use of 20 times or more.

Example 2

In the same manner as in Example 1, five copper pipes (their cross section is oval, having a major diameter of 25 mm, a minor diameter of 8 mm and a pipe wall thickness of 1.5 mm) were aligned in the same iron chamber as that used in Example 1. A mixed silicon carbide powder (#120/#400=3/1) was formed into a slurry with 3% silica sol in such a manner that the powder content could be 500 g/liter. The slurry was cast into the space of the iron chamber. This was dried at 120° C., and then fired in air at 600° C., and a silicon carbide shaped article with copper pipes built therein was thus obtained.

In the same manner as in Example 1, a copper plate was disposed on both faces of the shaped article. Also similarly, an aluminium melt was cast into the chamber and solidified under high pressure, and a backing plate was thus obtained, comprising a composite material of aluminium and silicon carbide, having copper pipes built therein, and having copper plates disposed on both surfaces thereof.

The linear expansion coefficient of the backing plate was $8.3 \times 10^{-6}$/K.

Next, onto the copper plate disposed on one side of the backing plate, a solder tin was applied at 280° C. Next, a titanium sputtering target (having a thickness of 16 mm, a length of 1,900 mm and a width of 350 mm) was bonded to it to complete a sputtering target structure of the invention. In this, the solder wettability of the parts was good.

Comparative Example 1

A molybdenum sputtering target was bonded to a copper backing plate having a thickness of 1 mm, a length of 2,000 mm and a width of 400 mm, using a solder tin, to thereby construct a sputtering target structure (with a cooling channel built therein).

This was used in sputtering, but it warped too much and therefore could not serve as a sputtering target.

Industrial Applicability

In the sputtering target structure of the invention, the linear expansion coefficient difference between the sputtering target and the backing plate is extremely small. Accordingly, when the two members are bonded together with a solder material, they do not warp and can be formed into the intended sputtering target structure. In the invention, in addition, inexpensive tin may be used as the solder. In particular, in the sputtering system to be used in a process of producing liquid-crystal devices, the sputtering area is large. In such a system, the sputtering target structure of the invention having a small linear expansion coefficient difference is expected to make a great contribution to the stabilization of the process of producing liquid-crystal devices.

The invention claimed is:

1. A method for manufacturing a sputtering target structure by bonding a sputtering target and a backing plate, wherein the backing plate is formed of a material that has a linear expansion coefficient different from that of the sputtering target material by at most $2 \times 10^{-6}$/K, wherein a copper plate having a thickness of from 0.3 to 1.5 mm is disposed on at least one face of the backing plate, and wherein the backing plate has a cooling channel made of copper or stainless steel pipes running therethrough, the method comprising:

forming the backing plate by subjecting a mold containing copper or stainless steel pipes and a reinforcing material to heat treatment to obtain a sintered body of the reinforcing material integrally formed with a cooling channel made of the pipes running therethrough, fitting a copper plate to the sintered body of the reinforcing material, putting the sintered body of the reinforcing material with the copper plate fitted thereto in a pressure casting mold, and casting aluminum melt into the mold followed by solidification under pressure; and boding the sputtering target to the formed backing plate.

2. The method for manufacturing a sputtering target structure as claimed in claim 1, wherein a material constituting the backing plate is a composite material that comprises aluminum or aluminum alloy as the matrix and, as incorporated therein, one or more granular or fibrous reinforcing materials selected from a group consisting of carbon, silicon carbide, alumina, silicon nitride, mullite and aluminum borate, and the material has a linear expansion coefficient of from 3.5 to $17 \times 10^{-6}$/K.

3. The method for manufacturing a sputtering target structure as claimed in claim 1, wherein the sputtering target and the backing plate are bonded together with indium, tin or their alloy.

* * * * *